US009805795B2

(12) United States Patent
Rakshit et al.

(10) Patent No.: US 9,805,795 B2
(45) Date of Patent: Oct. 31, 2017

(54) ZERO LEAKAGE, HIGH NOISE MARGIN COUPLED GIANT SPIN HALL BASED RETENTION LATCH

(71) Applicant: Samsung Electronics Co., Ltd., Suwon-si, Gyeonggi-do (KR)

(72) Inventors: Titash Rakshit, Austin, TX (US); Borna Obradovic, Leander, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/265,825

(22) Filed: Sep. 14, 2016

(65) Prior Publication Data
US 2017/0200499 A1    Jul. 13, 2017

Related U.S. Application Data

(60) Provisional application No. 62/276,690, filed on Jan. 8, 2016.

(51) Int. Cl.
G11C 11/00      (2006.01)
G11C 14/00      (2006.01)
(Continued)

(52) U.S. Cl.
CPC ........ *G11C 14/0081* (2013.01); *G11C 11/161* (2013.01); *G11C 11/1673* (2013.01);
(Continued)

(58) Field of Classification Search
CPC . G11C 14/0081; G11C 14/0054; G11C 11/18; G11C 11/1673; G11C 11/1675;
(Continued)

(56) References Cited

U.S. PATENT DOCUMENTS 8,125,040 B2    2/2012   Kang et al.
9,117,521 B2    8/2015   Guillemenet et al.
(Continued)

OTHER PUBLICATIONS

Pan, Xiang and Teodorescu, Radu, "NVSleep: Using Non-Volatile Memory to Enable Fast Sleep/Wakeup of Idle Cores", Department of Computer Science and Engineering, The Ohio State University, Columbus, OH , Computer Design (ICCD), 2014 32nd IEEE International Conference on IEEE, 2014. (url: http://web.cse.ohio-state.edu/~teodores/resources/papers/nvsleep_iccd14.pdf)    (8 pages).

(Continued)

Primary Examiner — Toan Le
(74) Attorney, Agent, or Firm — Lewis Roca Rothgerber Christie LLP

(57) ABSTRACT

A non-volatile data retention circuit, which is configured to store complementary volatile charge states of an external latch, comprises a coupled giant spin hall latch configured to generate and store complementary non-volatile spin states corresponding to the complementary volatile charge states of the external latch in response to receiving a charge current from the external latch, and to generate a differential charge current signal corresponding to the complementary non-volatile spin states in response to application of a read voltage, a write switch coupled to the coupled giant spin hall latch and configured to selectively enable flow of the charge current from the external latch to the coupled giant spin hall latch in response to a sleep signal, and a read switch coupled to the coupled giant spin hall latch and to selectively enable the application of the read voltage to the coupled giant spin hall latch.

19 Claims, 6 Drawing Sheets

(51) Int. Cl.
   *G11C 11/18* (2006.01)
   *G11C 11/16* (2006.01)
   *H01L 43/08* (2006.01)
   *H01L 43/04* (2006.01)
   *H01L 43/06* (2006.01)
   *H01L 43/10* (2006.01)

(52) U.S. Cl.
   CPC .......... *G11C 11/1675* (2013.01); *G11C 11/18* (2013.01); *H01L 43/04* (2013.01); *H01L 43/06* (2013.01); *H01L 43/08* (2013.01); *H01L 43/10* (2013.01)

(58) Field of Classification Search
   CPC ....... G11C 11/161; H01L 43/08; H01L 43/04; H01L 43/06; H01L 43/10
   See application file for complete search history.

(56) References Cited

U.S. PATENT DOCUMENTS

| | | | |
|---|---|---|---|
| 9,230,626 B2 | 1/2016 | Buhrman et al. | |
| 9,240,799 B1* | 1/2016 | Wang | H03M 1/142 |
| 2014/0149773 A1 | 5/2014 | Huang et al. | |
| 2014/0313834 A1* | 10/2014 | Fisch | G11C 29/52 365/185.18 |
| 2015/0036415 A1* | 2/2015 | Di Pendina | G11C 11/18 365/148 |
| 2015/0145576 A1* | 5/2015 | Wu | H01L 43/08 327/187 |
| 2015/0213868 A1 | 7/2015 | Wu et al. | |

OTHER PUBLICATIONS

Sharad, Mrigank and Roy, Kaushik., "Exploring Ultra Low-Power on-Chip Clocking Using Functionality Enhanced Spin-Torque Switches", Department of Electrical and Computer Engineering, Purdue University, West Lafayette, IN, http://arxiv.org/pdf/1401.0015 (5 pages), (Dec. 30, 2013).

* cited by examiner

ZERO LEAKAGE, HIGH NOISE MARGIN COUPLED GIANT SPIN HALL BASED RETENTION LATCH

CROSS-REFERENCE TO RELATED APPLICATION(S)

This application claims the benefit and the priority of U.S. Provisional Patent Application No. 62/276,690 filed Jan. 8, 2016, the entire content of which is incorporated herein by reference.

FIELD

Aspects of the present invention relate to the field of data retention in memory systems.

BACKGROUND

Generally, a microprocessor of an electronic device continues to burn power even when the device is idle and the microprocessor is in sleep or hibernation mode, as a result of leakage currents flowing through the transistors of the microprocessor. Power to the transistors cannot be turned off entirely at sleep mode due to the existence of latches/flops and SRAMs in a volatile (data) charge based processor. While generally undesirable, power leakage is even more important in mobile devices where idle time may be long and battery life is of critical importance.

As leakage power scales with supply voltage, power leakage during idle periods may be reduced by lowering the supply voltage to the minimum voltage required for data retention known as Vccmin. However, as Vccmin is non-zero, and may, in some technologies, be about 0.4 V to about 0.5 V, current leakage persists. Other methods for mitigating this leakage problem may include using volatile shadow latches/circuits constructed with low leakage devices to lower leakage, or transferring most of the volatile data to the non-volatile RAM or storage during sleep mode. However, these approaches lead to very complicated circuits and long wake-up periods as data needs to be properly transferred back to the processor devices/latches/SRAMs. A further approach may involve the implementation of ferroelectric storage adjacent to the volatile storage element. However, even in this approach, the storage media still burns substantial dynamic power.

The above information disclosed in this Background section is only for enhancement of understanding of the background of the invention, and therefore it may contain information that does not form the prior art that is already known to a person of ordinary skill in the art.

SUMMARY

Aspects of embodiments of the present invention are directed to a non-volatile high noise margin (NVHNM) data retention circuit that converts complementary charge bits of a latch/SRAM to complementary non-volatile spin bits using the Giant Spin Hall effect. The NVHNM retention circuit acts as a zero- (or near zero-) leakage shadow latch that may be attached to any circuit element (e.g., flop/latch/SRAM) for which it is desirable to retain non-volatile data in idle mode (e.g., sleep or hibernation mode).

According to some embodiments of the present invention, there is provided a non-volatile data retention circuit configured to store complementary states of volatile charge bits of an external latch, the non-volatile data retention circuit including: a coupled giant spin hall latch configured to generate and store complementary states of non-volatile spin bits corresponding to the complementary states of volatile charge bits of the external latch in response to receiving a charge current from the external latch, and to generate a differential charge current signal corresponding to the complementary states of non-volatile spin bits in response to application of a read voltage (e.g., voltages on bitline and bitline bar); a write switch coupled to the coupled giant spin hall latch and configured to selectively enable flow of the charge current from the external latch to the coupled giant spin hall latch in response to a sleep signal; and a read switch coupled to the coupled giant spin hall latch and to selectively enable the application of the read voltage to the bitline and bitline bar.

In some embodiments, the charge current from the external latch corresponds to the states of complementary volatile charge bits of the external latch.

In some embodiments, the coupled giant spin hall latch includes: a giant spin hall metal coupled to the write switch and the read switch and configured to pass the charge current of the external latch; a first spin transfer torque (STT) stack at a first side of the giant spin hall metal; and a second STT stack at a second side of the giant spin hall metal opposite to the first side, wherein the first and second STT stacks extend along a direction orthogonal to an extension direction of the giant spin hall metal, and are configured to generate and store the complementary states of the non-volatile spin bits.

In some embodiments, the write switch includes a first write switch and a second write switch coupled to opposite ends of the giant spin hall metal and to first and second outputs of the external latch.

In some embodiments, the giant spin hall metal includes beta tantalum, platinum, and/or copper bismuth (CuBi).

In some embodiments, in response to the charge current flowing through the giant spin hall metal, the first STT stack (e.g., the free magnetic layer, which is capable of switching magnetic moment) is configured to exhibit magnetic moments having a parallel configuration (with reference to the fixed or reference layer, which has a fixed magnetic moment), and the second STT stack (e.g., the free magnetic layer, which is capable of switching magnetic moment) is configured to exhibit magnetic moments having an anti-parallel configuration (with reference to the fixed or reference layer), and the first and second STT stacks are configured to maintain their parallel and anti-parallel configurations even when no power is provided to the non-volatile data retention circuit.

In some embodiments, the parallel configuration of the first STT stack (e.g., the free magnetic layer) and the anti-parallel configuration of the second STT stack (e.g., the free magnetic layer) correspond to storage of the complementary states of the non-volatile spin bits at the first and second STT stacks.

In some embodiments, each of the first and second STT stacks include: a free layer including magnetic material and configured to respond to a spin current corresponding to the charge current flowing through the giant spin hall metal based on a giant spin hall effect, and to exhibit a free magnetic moment corresponding in direction to the generated spin current; a fixed layer including magnetic material and exhibiting a fixed magnetic moment unaffected by stray fields resulting from the charge current flowing through the giant spin hall metal; and a non-magnetic layer between the free and fixed layers and configured to magnetically isolate the free magnetic moment of the free layer from the fixed magnetic moment of the fixed layer and to maintain any existing difference in directionality of the free and fixed magnetic moments.

In some embodiments, the free magnetic moment of the first STT stack is parallel with that of the fixed magnetic moment of the second STT stack.

In some embodiments, in response to the charge current flowing through the giant spin hall metal, the free layer of the first STT stack is configured to exhibit a first free magnetic moment parallel with the fixed magnetic moment of the corresponding fixed layer, and the free layer of the second STT stack is configured to exhibit a second free magnetic moment anti-parallel with the fixed magnetic moment of the corresponding fixed layer.

In some embodiments, the non-magnetic layer includes one or more of crystalline MgO and amorphous aluminum oxide and each of the free layers of the first and second STT stacks include one or more of CoFeB, Fe, and CoFe.

In some embodiments, each of the fixed layers of the first and second STT stacks include a synthetic antiferromagnetic layer.

In some embodiments, the synthetic antiferromagnetic layer includes a plurality of magnetic layers antiferromagnetically coupled through and interleaved with thin conductive layers.

In some embodiments, coupled giant spin hall latch is configured to continue storing the complementary non-volatile spin bits even when no power is provided to the non-volatile data retention circuit.

According to some embodiments of the present invention, there is provided a data retention system including: a first volatile data latch configured to store complementary states of the volatile charge bits; a status indicator configured to generate a sleep signal and a wake signal based on a power mode of the data retention system; a non-volatile data retention circuit including: a coupled giant spin hall latch configured to generate and store complementary states of the non-volatile spin bits corresponding to the complementary states of the volatile charge bits of the first volatile data latch in response to receiving a charge current from the first volatile data latch, and to generate a differential charge current signal corresponding to the complementary states of the non-volatile spin bits in response to application of a read voltage; a write switch configured to selectively enable flow of the charge current from the first volatile data latch to the coupled giant spin hall latch in response to the sleep signal; and a read switch configured to selectively enable the application of the read voltage to the coupled giant spin hall latch in response to the wake signal; and a second output volatile data latch configured to read the complementary states of the non-volatile spin bits from the non-volatile data retention circuit at power on.

In some embodiments, the first volatile data latch configured to store volatile complementary states of the bits only when powered on, and the first and second volatile data latches are the same.

According to some embodiments of the present invention, there is provided a method of retaining complementary states of the volatile charge bits of a volatile data latch when powered down, the method including: receiving a sleep signal indicative of initiation of power down mode from a status indicator; and in response to receiving the sleep signal: coupling, via a write switch, output nodes of the volatile data latch to opposite ends of a giant spin hall metal of a coupled giant spin hall latch to receive a charge current from the volatile data latch through the giant spin hall metal; and generating and storing, by the coupled giant spin hall latch, complementary states of the non-volatile spin bits corresponding to the complementary states of the volatile charge bits of the volatile data latch in response to receiving the charge current from the volatile data latch.

In some embodiments, the method further includes decoupling, via a read switch, the giant spin hall metal from a low voltage in response to receiving the sleep signal.

According to some embodiments of the present invention, there is provided a method of restoring complementary states of the volatile charge bits of a volatile data latch when powering up, the method including: receiving a wake signal indicative of initiation of power up mode from a status indicator; and in response to receiving the wake signal: coupling, via a read switch, a giant spin hall metal of a coupled giant spin hall latch to a low voltage; coupling ends of first and second spin transfer torque (STT) stacks of the coupled giant spin hall latch not adjacent to the giant spin hall metal to apply a read voltage to the coupled giant spin hall latch; and generating a differential charge current signal corresponding to complementary states of the non-volatile spin bits stored in the first and second STT stacks, in response to applying the read voltage.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
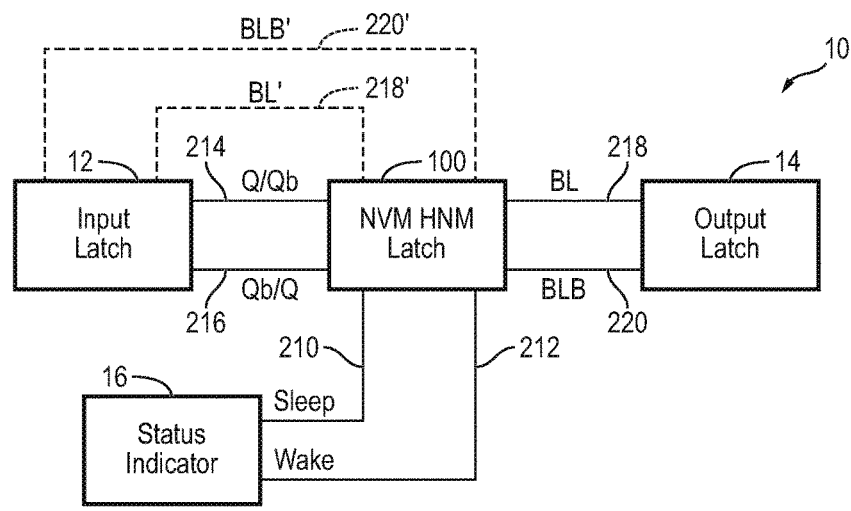
FIG. 1 is a schematic diagram of a data retention system utilizing a non-volatile data retention circuit, according to some example embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

FIG. 1 is a schematic diagram of a data retention system 10 utilizing a non-volatile data retention circuit 100, according to some example embodiments of the present invention.

Referring to FIG. 1, the data retention system 10 enables a zero- (or near zero-) leakage retention of non-volatile data of an input latch (e.g., a first volatile data latch or an external latch) 12 when idle, that is, when the non-volatile data is not subject to a read or write request, such as may be the case when the electronic device that the data retention system 10 is part of is powered down (e.g., is powered off or is in sleep/hibernation mode). The non-volatile data retention circuit 100 acts as a shadow latch for storing complementary states of non-volatile data at the input latch 12 (represented with Q and Qb in FIG. 1) when in idle mode. According to some embodiments, the non-volatile data retention circuit 100 uses the Giant Spin Hall effect to convert the complementary charge states of the input latch 12 to complementary spin states. When retrieving the stored complementary states (e.g., when waking from idle mode), the non-volatile data retention circuit 100 converts the stored complementary spin states to complementary charge states for transfer to the output latch (e.g., a second volatile data latch) 14.

The status indicator 16 may provide a sleep signal and a wake signal indicating the initiation of the idle and wake modes, respectively, to the data retention circuit 100 and initiate the storing and retrieving, respectively, of the complementary states.

The input and output latches 12 and 14 may represent electrical charge based volatile storage, such as flip-flops, static random access memory (SRAM), or the like, in a sequential part of a microprocessor (e.g., a CPU) or the like and, for example, store results of operations within the microprocessor, perform clock synchronization, and/or the like. In some examples, output bitlines of the data retention circuit 100 may be coupled to the input latch 12, rather than the output latch 14, that is, the non-volatile data retention circuit 100 may restore the complementary states back to the input latch 12 at power up (e.g., at power on or initiation of wake mode). In other embodiments, the output latch 14 may represent a stage subsequent to the input latch 12.

In some examples, the non-volatile data retention circuit 100 may be electrically coupled to and reside near (e.g., be adjacent to) the input and output latches 12 and 14. This close proximity reduces traditional power gating delay or power for sequentials where either data has to be transferred all the way to a non-volatile storage outside of the logic chip or data is transferred locally to a low leakage latch.

While the data retention system 10 of FIG. 1 allows for the zero-leakage retention of a single state of non-volatile data, as will be understood by a person of ordinary skill in the art, the data retention system 10 may be readily expanded to store any number of non-volatile bits.

Figure 2:
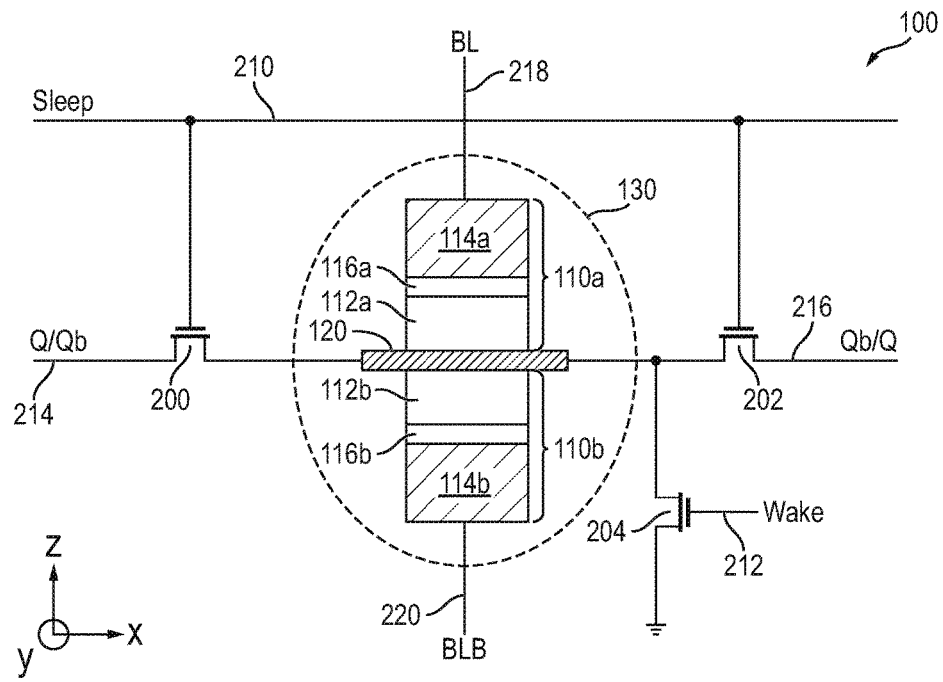
FIG. 2 is a schematic diagram of a non-volatile high noise margin retention latch circuit, according to some embodiments of the present invention.

FIG. 2 is a schematic diagram of a non-volatile high noise margin retention latch circuit 100, according to some embodiments of the present invention.

According to some embodiments, the non-volatile data retention circuit 100 includes first and second Spin Transfer Torque (STT) stacks 110a and 110b on opposite sides (e.g., in opposite Z directions) of, and adjacent to, a Giant Spin Hall metal 120, which is a metal, such as beta tantalum, platinum, copper bismuth (CuBi), and/or the like. The two stacks of STT devices 110a and 110b along with the Giant Spin Hall metal 120 will henceforth be referred to as a Coupled Giant Spin Hall Latch (CGSHL) 130. The passage of charge current through the Giant Spin Hall metal 120 induces the concurrent (e.g., simultaneous) storage of complementary binary '0'/'1' or '1'/'0' states in the first and second STT stacks 110a and 110b in the form of complementary non-volatile spin states, as a result of the Giant Spin Hall effect.

In some embodiments, the non-volatile data retention circuit 100 further includes first and second write switches (e.g., metal oxide semiconductor (MOS) transistors) 200 and 202 and a read switch (e.g., a MOS transistor) 204 that enable data read and write operations of the non-volatile data retention circuit 130. The first and second write switches 200 and 202 are coupled to opposite ends of the Giant Spin Hall metal 120 and are configured to enable the writing of complementary binary states onto the CGSHL 130 in response to a sleep signal SLEEP received on the line 210 from the status indicator 16. The read switch 204 is coupled to one end of the Giant Spin Hall metal 120. The read switch 204 is configured to enable the reading of stored complementary states in response to a wake signal WAKE received on the line 212 from the status indicator 16. While FIG. 2 only shows a single read switch 204 coupled to one end of the Giant Spin Hall metal 120, embodiments of the present invention are not limited thereto, and the non-volatile data retention circuit 100 may include two read switches coupled to opposing ends of the Giant Spin Hall metal 120, which are coupled to the first and second write switches 200 and 202. The read operation also involves precharging the first and second bitlines 218 and 220 (bitline BL and bitline bar BLB) to a voltage (e.g., half of a supply voltage (VDD/2)). The supply voltage VDD may be about 0.6 V to about 4 V.

Each of the first and second STT stacks 110a/110b includes a free layer 112a/112b adjacent to the Giant Spin Hall metal 120, a fixed layer 114a/114b, and a nonmagnetic tunneling barrier layer 116a/116b, such as crystalline magnesium oxide (MgO), amorphous aluminum oxide, and/or the like separating the free and fixed layers 112a/112b and 114a/114b.

The free layer 112a/112b and the fixed layer 114a/114b are magnetic. According to some embodiments, the magnetic moments (e.g., the fixed magnetic moments) of the fixed layers 114a and 114b are collinear and pinned in a particular direction, for example, the Y direction in the XY plane direction shown in FIG. 2, which is orthogonal or substantially orthogonal to height direction of the first and second STT stacks 110a and 110b and the charge current passing through the Giant Spin Hall metal 120. The magnetic moments may be fixed through an exchange-bias interaction with an antiferromagnetic (AFM) layer. FIG. 2 illustrates the fixed layer 114a/114b as having a single layer; however, embodiments of the present invention are not limited thereto, and the fixed layer 114a/114b may include a plurality of layers. For example, the fixed layer 114a/114b may be a synthetic antiferromagnetic (SAF) layer including magnetic layers antiferromagnetically coupled through and interleaved with thin conductive layers, such as ruthenium (Ru) and/or the like.

As charge current passes through the Giant Spin Hall metal 120 (e.g., along the X direction), a flow of spin current is generated in an orthogonal direction (e.g., +/−Z direction) that provides a torque that flips the magnetic moment in a direction (e.g., in a +/−Y direction) that is transverse to the direction of charge current flow. The resulting spin current then may switch the magnetic orientation of the adjacent first and second free layers 112a and 112b as a result of the Giant Spin Hall effect. The first and second free layers 112a and 112b may include iron (Fe), a cobalt iron allow (e.g., CoFe), a cobalt iron boron alloy (e.g., CoFeB), and/or the like. As the first and second free layers 112a and 112b are on opposing sides of the Giant Spin Hall metal 120, the magnetic orientations of the first free layer 112a may be the opposite of that of the second free layer 112b (e.g., one is in −Y direction, while the other is in +Y direction). According to some embodiments, the magnetic orientation of the fixed layer 114a/114b is fixed and is immune to and not affected by (or not substantially affected by) the stray fields resulting from the charge current flow through the Giant Spin Hall metal 120. The nonmagnetic tunneling barrier layer 116a/116b serves to magnetically isolate the magnetic moment (e.g., free magnetic moment) of the free layer 112a/112b from the fixed magnetic moment of the fixed layer 114a/114b and to maintain any existing difference in directionality of the free and fixed magnetic moments (i.e., prevent the fixed magnetic moment of the fixed layer 114a/114b from influencing and changing the directionality of the free magnetic moment of the free layers 112a/112b). In other embodiments in which an external magnetic field is present and the magnetic moments of the fixed layers 114a and 114b are oriented in the +Z or −Z direction, the charge current passing through the Giant Spin Hall metal 120 may flip the magnetic moments of the free layers 112a and 112b in the +/−Z and −/+Z direction, respectively.

Figure 3A:
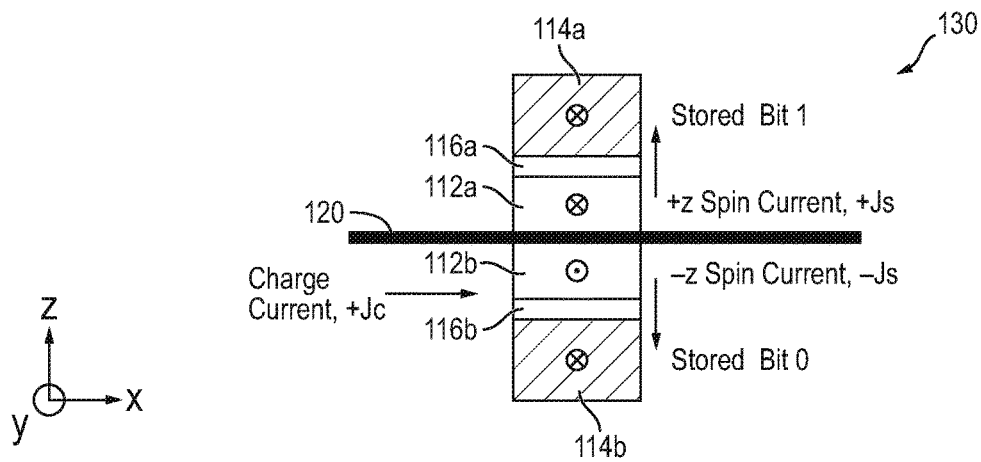
FIGS. 3A and 4A are conceptual diagrams illustrating the process of storing complementary states of bits in a Coupled Giant Spin Hall Latch, according to some embodiments of the present invention.
Figure 3B:
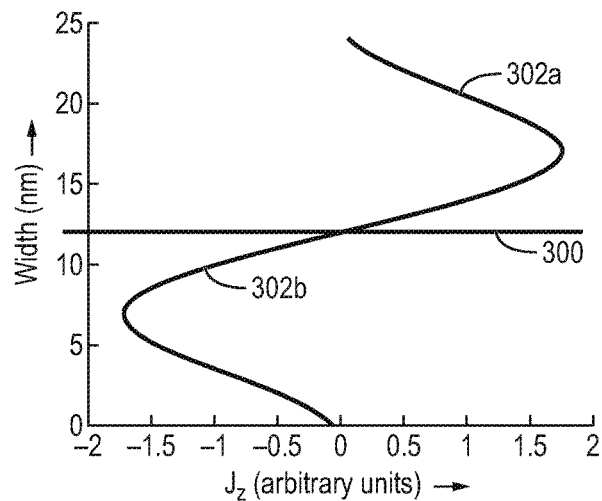
FIGS. 3B and 4B are conceptual diagrams illustrating the simulated propagation of spin current induced in the free layers Coupled Giant Spin Hall Latch, according to some embodiments of the present invention.
Figure 3C:
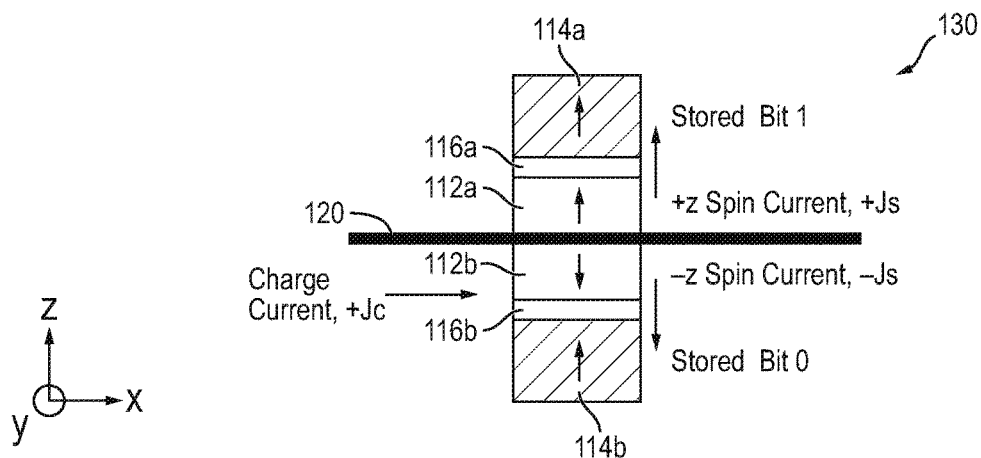
FIGS. 3C and 4C are conceptual diagrams illustrating the process of storing complementary states, according to some alternative embodiments of the present invention.
Figure 4A:
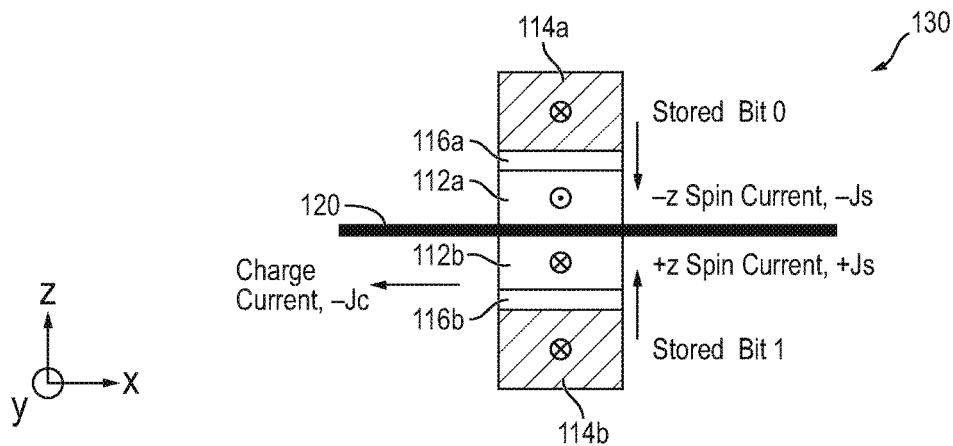
Figure 4B:
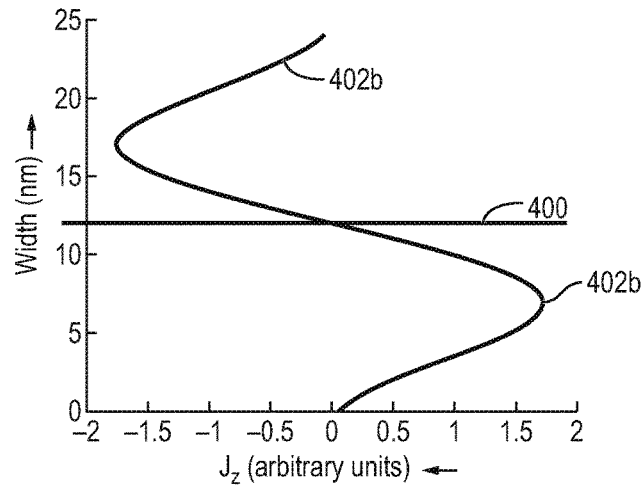
Figure 4C:
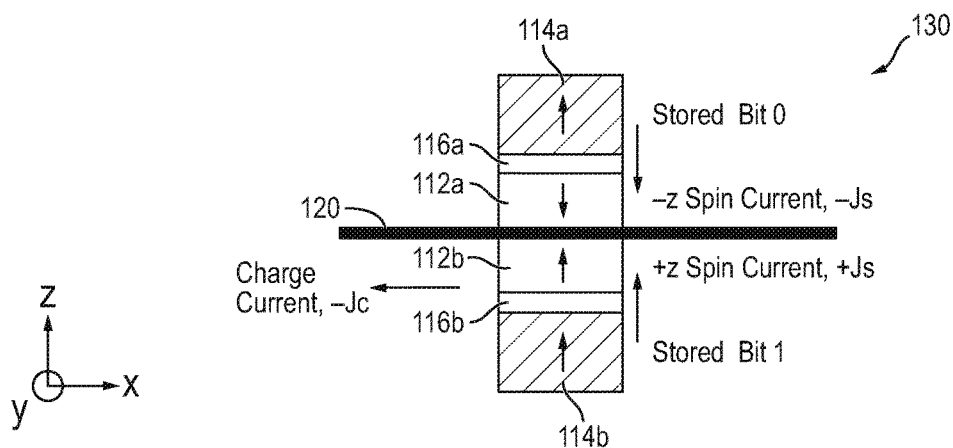

FIGS. 3A and 4A are conceptual diagrams illustrating the process of storing complementary I/O states and 0/1 states, respectively, in the CGSHL 130, according to some embodiments of the present invention. FIGS. 3B and 4B are conceptual diagrams illustrating the simulated propagation of spin current induced in the free layers 112a and 112b as a function of the height of the free layers, according to some embodiments of the present invention. FIGS. 3B and 4B correspond to the write operations illustrated in FIGS. 3A and 4B, respectively. FIGS. 3C and 4C are conceptual diagrams illustrating the process of storing complementary I/O states and 0/1 states, respectively, according to some alternative embodiments of the present invention.

Referring to FIG. 3A, when a charge current +Jc flows through the Giant Spin Hall metal 120 along its lengthwise direction (e.g., +X direction), the Giant Spin Hall effect generates a spin current +Js in the first free layer 112a (e.g., along the +Z direction) that induces the magnetic orientation of the first free layer 112a to be parallel or substantially parallel with and in the same or substantially the same direction as that of the first fixed layer 114a (e.g., the +Y direction). As the first and second free layers 112a and 112b are located on opposite sides of the Giant Spin Hall metal 120, the same charge current Jc generates a spin current −Js in the second free layer 112b (e.g., along the −Z direction) that induces the magnetic orientation of the second free layer 112b to be parallel with and in the opposite direction as that of the first free layer. As the first and second fixed layers 114a and 114b have magnetic orientations that are in the same or substantially the same direction (e.g., the +Y direction), the charge current +Jc causes the magnetic orientations of the second free layer 112b and the second fixed layer to be anti-parallel. Here, the fixed layer 114a/114b has strong magnetic polarization and acts as a point of reference for magnetic polarization (or magnetic moments).

The anti-parallel nature of the induced spin current in the first and second free layers 112a and 112b is further illustrated in FIG. 3B where the line 300 represents the location of the Giant Spin Hall metal 120, and the curves 302a and 302b represent the magnitude of spin current in the first and second free layers 112a and 112b, respectively. As can be seen, the magnitude of the spin current reaches a peak at a certain point along the height (in the Z direction) of free layers 112a and 112b before trailing off to lower values at higher heights.

Thus, as illustrated in FIG. 3A, the first STT stack 110a exhibits a parallel configuration, while the second STT stack 110b exhibits an anti-parallel configuration. According to some examples, the parallel configuration of the first stack 110a may represent the storage of a binary '1' state. The anti-parallel configuration of the second stack 110b may represent the storage of a binary '0' state. However, embodiments of the present invention are not limited thereto, and the parallel and anti-parallel magnetic orientations may represent a binary '0' state and a binary '1' state, respectively. Accordingly, the charge current +Jc flowing through the Giant Spin Hall metal 120 may induce the CGSHL 130 to concurrently (e.g., simultaneously) store complementary states '1' and '0' in the first and second STT stacks 110a and 110b, respectively.

As illustrated in FIG. 3C, in other embodiments in which an external magnetic field is present and the magnetic moments of the fixed layers 114a and 114b are oriented in the +Z direction, the charge current passing through the Giant Spin Hall metal 120 along the +X direction may flip the magnetic moments of the free layers 112a and 112b in the +Z and −Z direction, respectively.

Referring to FIG. 4A, when a charge current −Jc flows through the Giant Spin Hall metal 120 along a direction opposite that of FIG. 3A (e.g., −X direction), the Giant Spin Hall effect generates a spin current −Js in the first free layer 112a (e.g., along the −Z direction) that induces the magnetic orientation of the first free layer 112a to be substantially parallel with and in the opposite direction as that of the first fixed layer 114a (e.g., the −Y direction). The same charge current −Jc also generates a spin current +Js in the second free layer 112b (e.g., along the +Z direction) that induces the magnetic orientation of the second free layer 112b to be parallel or substantially parallel with and in the same or substantially the same direction as that of the second fixed layer 114b (e.g., the +Y direction).

The reversal of the directions of the spin currents in the free layers 112a and 112b when the direction of the charge current through the Giant Spin Hall metal 120 is reversed is further illustrated in FIG. 4B. Similar to FIG. 3B, in FIG. 4B, the line 400 represents the location of the Giant Spin Hall metal 120, and the curves 402a and 402b represent the magnitude of spin current in the first and second free layers 112a and 112b, respectively.

As illustrated in FIG. 4C, in other embodiments in which an external magnetic field is present and the magnetic moments of the fixed layers 114a and 114b are oriented in the +Z direction, the charge current passing through the Giant Spin Hall metal 120 along the −X direction may flip the magnetic moments of the free layers 112a and 112b in the −Z and +Z direction, respectively.

According to some embodiments, the anti-parallel configuration of the first STT stack 110a corresponds to the storage of a binary '0' state, and the parallel configuration of the second STT stack 110b corresponds to the storage of a binary '1' state (the retention of the parallel and anti-parallel configurations may also be referred to as retention of complementary non-volatile spin states). Thus, the charge current −Jc flowing through the Giant Spin Hall metal 120 may induce the CGSHL 130 to concurrently (e.g., simultaneously) store complementary states '0' and '1' in the first and second STT stacks 110a and 110b, respectively.

According to some embodiments, the first and second STT stacks 110a and 110b maintain their parallel and anti-parallel configurations even after cessation of the charge current Jc through the Giant Spin Hall metal 120. As such, the CGSHL 130 maintains its complementary non-volatile spin states even in the absence of power being provided to the non-volatile data retention circuit 100.

Referring again to FIGS. 1 and 2, when the data retention system 10 is powered down (e.g., powered off or is in sleep/hibernation mode), the status indicator 16 sends the sleep signal SLEEP to line 210, which in turn activates (e.g., turn on) the first and second write switches 200 and 202, which are coupled to the output nodes of the input latch 12 through the complementary state carrying lines 214 and 216. This initiates the write operation of the CGSHL 130. In some examples, the status indicator 16 may also deactivate the read switch 204 by disabling or not sending the wake signal WAKE to line 212, and the first and second states lines 218 and 220 may receive the same low voltage (e.g., ground voltage or about 0 V). In some examples, the first and second write switches and the read switch 204 may be a NMOS transistor; however, as will be understood by a person of ordinary skill in the art, switches 200, 202, and 204 may also be PMOS transistors (or the like) so long as the control signals are inverted.

In some examples, the complementary state carrying lines 214 and 216 carry binary data signals Q and Qb, respectively. During a write operation, when the data signals Q and Qb represent binary states '1' and '0', a charge current +Jc may flow through the Giant Spin Hall metal 120 causing the first and second STT stacks to respectively store spins bits representative of binary states '1' and '0', as described above. Similarly, when the data signals Q and Qb represent binary bits '0' and '1', a charge current −Jc may flow through the Giant Spin Hall metal 120 causing the first and second STT stacks to respectively store spins states representative of binary states '0' and '1'. As such, the CGSHL 130 is able to store complementary spin states that are analogs of and mirror the complementary states stored in the input latch 12 during a power down. Because no back-to-back latch connection is needed to store complementary state pairs of '0'/'1' or '1'/'0', the design of the non-volatile data retention circuit 100 leads to reduction in overall area usage.

According to some embodiments, the status indicator 16 deactivates the first and second write transistors 200 and 202 and the read transistor 204 once the complementary state data is transferred to the non-volatile data retention circuit 100, which allows for zero (or substantially zero) leakage and true non-volatile data storage data retention system 10.

When the data retention system 10 is powered back on or enters a wake mode, the status indicator 16 sends the wake signal WAKE to line 212, which in turn activates (e.g., turn on) the read switch 204, which couples the Giant Spin Hall metal 120 to a low voltage (e.g., a ground voltage or about 0 V). This initiates the read operation of the CGSHL 130. In some examples, the status indicator 16 may also deactivate the first and second write switches 200 and 202 by disabling or not sending the sleep signal SLEEP to line 210.

During a read operation, the first and second bits lines 218 and 220 may receive the same or substantially the same voltage, which may be substantially lower than the supply voltage VDD (e.g., about 200 mV to about 1 V lower than the supply voltage VDD). As the read switch 204 may couple the Giant Spin Hall metal 120 to a low voltage (e.g., a ground voltage or about 0 V), a voltage differential will develop across each of the two STT stacks 110a and 110b, which may generate a current through at least one of the first and second STT stacks 110a and. When an STT stack 110a/110b has a parallel configuration (e.g., when a binary '1' state is stored), the stack is conductive and the resulting current is high, thus pulling the voltage at the bitline 218/220 close to the low voltage (of, e.g., 0 V). When the STT stack 110a/110b has an anti-parallel configuration (e.g., if a binary '0' state was stored), the stack acts as an insulator, and the resulting is significantly lower than that of the parallel configuration (e.g., may be almost zero or negligibly low). In some examples, the higher current of the parallel configuration is representative of a binary '1' state, while a lower (e.g., a substantially lower, and almost negligible) current of the anti-parallel configuration is representative of a binary '0' state. Thus, the read operation is performed by means of the magnetoresistance (e.g., tunnel magnetoresistance or TMR) of the first and second STT stacks 110a and 110b. The output latch 14 reads the outputs of the first and second STT stacks 110a and 110b through the first and second bits lines 218 and 220 at wake time (e.g., in response to the wake signal from the status indicator 16). According to some embodiments, the read operation is performed differentially, which leads to higher read noise margins.

The write and read operations of the data retention system 10, therefore, enable a seamless volatile charge to non-volatile spin and non-volatile spin to volatile charge transition of states.

According to some embodiments, the CGSHL 130 may be optimized for low dynamic power write and very fast, low error rate read. As the CGSHL 130 has separate write and read paths (e.g., the write and read currents may flow along the X and Z directions, respectively), in some examples, the read speed may be higher than the write speed. This may be achieved because the Giant Spin Hall metal 120 is decoupled from the first and second STT stacks 110a and 110b that are optimized for fast read due to the high magnetoresistance of the STT stacks 110a and 110b. The write operations consume low dynamic energy due to the high spin hall angles in the Giant Spin Hall metal 120, which lead to more than ten times the spin current from one times the charge current. Here, the Giant Spin Hall metal 120 (e.g., its material and/or dimensions) determines write energy and efficiency. According to some embodiments, higher spin hall angles lead to lower dynamic energy consumption. In some examples, the dynamic energy consumption may be about 0.1 fJ to about 100 fJ per write operation.

The low dynamic energy writes, fast reads (which translate to fast power on sequences), and zero-leakage data storage, make the non-volatile, high noise margin data retention circuit (e.g., shadow retention latch) 100 very suitable for microprocessor power gating as well as other applications.

In some examples, the dual STT stacks 110a and 110b are formed in interconnect metal levels, for example, between metal levels M0 and M2, and are connected to first and second write switches and the read switch, which may be NMOS transistors. Some embodiments of the present invention add process steps after the completion of CMOS front end process flow up to M0. The process may include the fabrication of 3 NMOS transistors for each non-volatile data retention circuit 100. The bit line 220 may be formed at metal layer M0. Beyond metal layer M0, areas designated for fabrication of non-volatile data retention circuits 100 are opened up and other areas are masked off. The second STT stack 110a may be formed in the −Z direction as shown in FIG. 2 above the metal layer M0 and below metal layer M1. The Giant Spin Hall metal 120 may be formed at metal layer M1. The first STT stack 110a may be identical to the second STT stack 110a and may be formed on the Giant Spin Hall metal 120 in the +Z direction in between metal layers M1 and M2. The bit line 218 may be formed at metal layer M2. Thus, the entire CGSHL 130 and its associated metal connections may be implemented in the back-end-of-line (BEOL) reducing area overhead.

Figure 5:
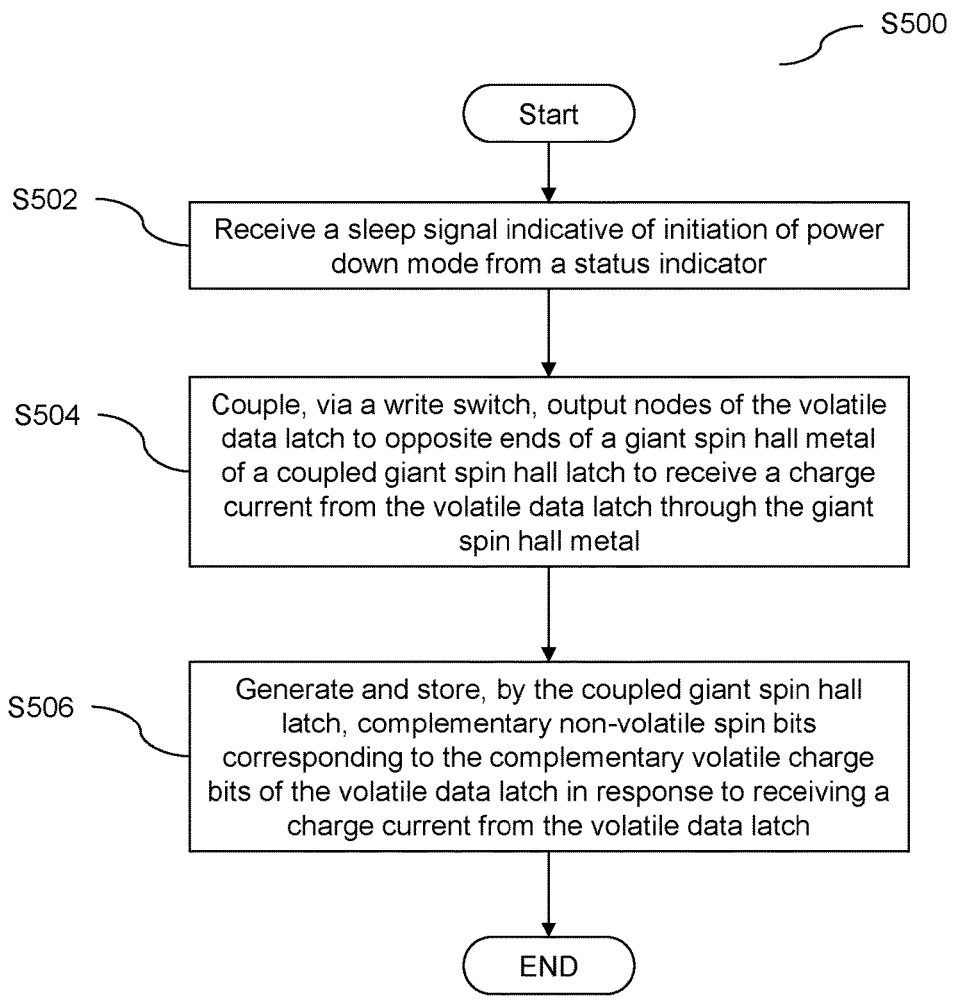
FIG. 5 is a flow diagram illustrating a process of retaining complementary states of volatile charge bits of the volatile data latch when powered down, according to some embodiments of the present invention.

FIG. 5 is a flow diagram illustrating a process S500 of retaining complementary volatile charge states of the volatile data latch 12 when powered down, according to some embodiments of the present invention.

In act S502, the non-volatile, high noise margin data retention circuit 100 receives a sleep signal SLEEP indicative of initiation of power down mode from a status indicator 16.

In act S504, in response to receiving the sleep signal SLEEP, a write switch (e.g., the first write switch 200 together with the second write switch 202) couples output nodes of the volatile data latch 12 to opposite ends of a giant spin hall metal 120 of the coupled giant spin hall latch 130 to receive a charge current from the volatile data latch 12 through the giant spin hall metal 120. The read switch 204 may decouple the giant spin hall metal 120 from a low voltage (e.g., ground or about 0 V) in response to receiving the sleep signal SLEEP.

In act S506, further in response to receiving the sleep signal SLEEP, the coupled giant spin hall latch 130 generates and stores complementary non-volatile spin states corresponding to the complementary volatile charge states of the volatile data latch 12 in response to receiving the charge current from the volatile data latch.

Figure 6:
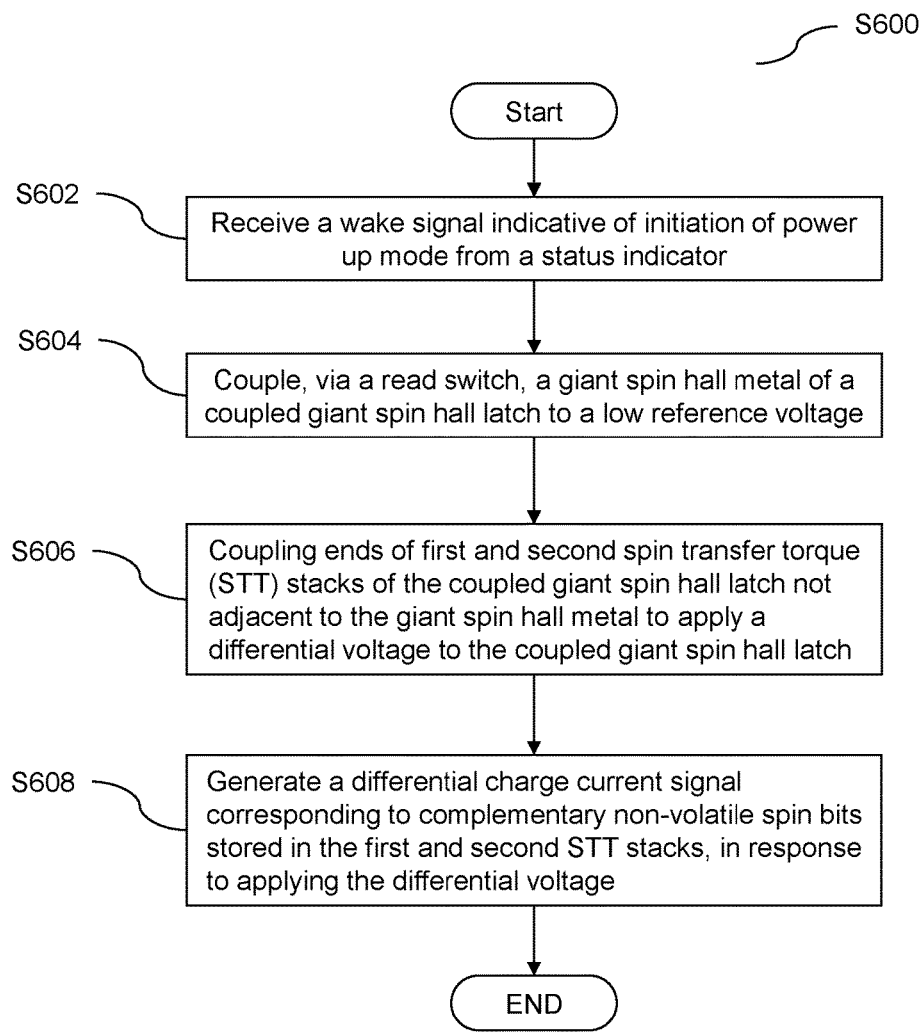
FIG. 6 is a flow diagram illustrating a process of restoring complementary states of volatile charge bits of the volatile data latch when powering up, according to some embodiments of the present invention.

FIG. 6 is a flow diagram illustrating a process S600 of restoring complementary volatile charge states of the volatile data latch 12 when powering up, according to some embodiments of the present invention.

In act S602, the non-volatile, high noise margin data retention circuit 100 receives a wake signal WAKE indicative of initiation of power up mode from the status indicator 16.

In act S604, in response to receiving the wake signal, the read switch 204 couples the giant spin hall metal 120 of the coupled giant spin hall latch 130 to a low voltage (e.g., ground or about 0V).

In act S606, further in response to receiving the wake signal, couple ends of the first and second spin transfer torque (STT) stacks 110a and 110b of the coupled giant spin hall latch 130 not adjacent to the giant spin hall metal (e.g., ends coupled to lines 218 and 220) to apply a differential voltage (e.g., a read voltage) to the coupled giant spin hall latch 130. The first and second write switches 200 and 202 may decouple the giant spin hall metal 120 from output nodes of the volatile data latch 12.

In act S608, still further in response to receiving the wake signal, the coupled giant spin hall latch 130 generates a differential charge current signal corresponding to complementary non-volatile spin states stored in the first and second STT stacks 110a and 110b, in response to applying the differential voltage (e.g., a read voltage).

Figure 7:
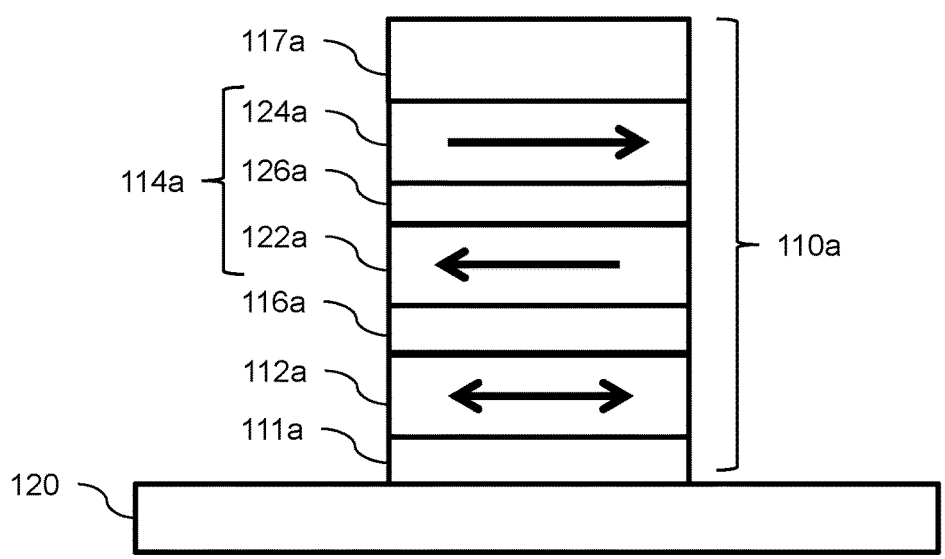
FIG. 7 is a cross-sectional schematic diagram of a spin transfer torque stack and a giant spin hall metal, according to some embodiments of the present invention.

FIG. 7 is a cross-sectional schematic diagram of the first STT stack 110a and the giant spin hall metal 120, according to some embodiments of the present invention. For the sake of ease of illustration, FIG. 7 does not show the second STT stack 110b, however, according to some embodiments, the second STT stack 110b is the same or substantially the same as the first STT stack 110a.

Referring to FIG. 7, in some embodiments, the first STT stack 110a further includes a transitional metal layer 111a (made of, e.g., hafnium (Hf)) between the giant spin hall metal 120 (made of, e.g., platinum (Pt)) and the free layer 112a, and an antiferromagnetic layer 117a (made of, e.g., a platinum manganese alloy (PtMn)) above the fixed layer 114a. According to some embodiments, the free layer 114a includes a reference layer 122a (made of, e.g., CoFeB), a pinned layer 124a (made of, e.g., CoFeB) antiferromagnetically coupled to the reference layer 122a through, and interleaved with, a non-magnetic conductive layer 126a (made of, e.g., tantalum (Ta), ruthenium (Ru), and/or the like).

According to some examples, the thickness (e.g., height along the Z direction) of the giant spin hall metal 120 may be about 1 nm to about 10 nm (e.g., about 4 nm), the thickness of the transitional metal layer 111a may be about 1 nm to about 4 nm (e.g., about 1 nm), the thickness of the free layer 112a may be about 1 nm to about 5 nm (e.g., about 1 nm), the thickness of the nonmagnetic tunneling barrier layer 116a may be about 1 nm to about 2 nm (e.g., about 1 nm), the thickness of each of the reference layer 122a and the pinned layer 124a may be about 4 nm to about 10 nm (e.g., about 4 nm), and the thickness of the non-magnetic conductive layer 126a may be about 0.4 nm to about 1 nm (e.g., about 0.4 nm).

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to,"

or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The data retention system and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the data retention system may be formed on one integrated circuit (IC) chip or on separate IC chips. Further, the various components of the data retention system may be implemented on a flexible printed circuit film, a tape carrier package (TCP), a printed circuit board (PCB), or formed on a same substrate. Further, the various components of the data retention system may be a process or thread, running on one or more processors, in one or more computing devices, executing computer program instructions and interacting with other system components for performing the various functionalities described herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A non-volatile data retention circuit configured to store complementary volatile charge states of an external latch, the non-volatile data retention circuit comprising:
a coupled giant spin hall latch configured to generate and store complementary non-volatile spin states corresponding to the complementary volatile charge states of the external latch in response to receiving a charge current from the external latch, and to generate a differential charge current signal corresponding to the complementary non-volatile spin states in response to application of a read voltage;
a write switch coupled to the coupled giant spin hall latch and configured to selectively enable flow of the charge current from the external latch to the coupled giant spin hall latch in response to a sleep signal; and
a read switch coupled to the coupled giant spin hall latch and to selectively enable the application of the read voltage to the coupled giant spin hall latch,
wherein the coupled giant spin hall latch comprises:
a giant spin hall metal coupled to the write switch and the read switch and configured to pass through the charge current of the external latch;
a first spin transfer torque (STT) stack at a first side of the giant spin hall metal; and
a second STT stack at a second side of the giant spin hall metal opposite to the first side,
wherein the first and second STT stacks extend along a direction orthogonal to an extension direction of the giant spin hall metal, and are configured to generate and store the complementary non-volatile spin states.

2. The non-volatile data retention circuit of claim 1, wherein the charge current from the external latch corresponds to the complementary volatile charge states of the external latch.

3. The non-volatile data retention circuit of claim 1, wherein the write switch comprises a first write switch and a second write switch coupled to opposite ends of the giant spin hall metal and to first and second outputs of the external latch.

4. The non-volatile data retention circuit of claim 1, wherein the giant spin hall metal comprises beta tantalum, platinum, and/or copper bismuth.

5. The non-volatile data retention circuit of claim 1, wherein, in response to the charge current flowing through the giant spin hall metal, the first STT stack is configured to exhibit magnetic moments having a parallel configuration, and the second STT stack is configured to exhibit magnetic moments having an anti-parallel configuration, and
wherein the first and second STT stacks are configured to maintain their parallel and anti-parallel configurations even when no power is provided to the non-volatile data retention circuit.

6. The non-volatile data retention circuit of claim 5, wherein the parallel configuration of the first STT stack and the anti-parallel configuration of the second STT stack correspond to storage of the complementary non-volatile spin states at the first and second STT stacks.

7. The non-volatile data retention circuit of claim 1, wherein each of the first and second STT stacks comprise:
a free layer comprising magnetic material and configured to respond to a spin current corresponding to the charge current flowing through the giant spin hall metal based on a giant spin hall effect, and to exhibit a free magnetic moment substantially orthogonal in direction to the spin current;
a fixed layer comprising magnetic material and exhibiting a fixed magnetic moment unaffected by stray fields resulting from the charge current flowing through the giant spin hall metal; and
a non-magnetic layer between the free and fixed layers and configured to magnetically isolate the free magnetic moment of the free layer from the fixed magnetic moment of the fixed layer and to maintain any existing difference in directionality of the free and fixed magnetic moments.

8. The non-volatile data retention circuit of claim 7, wherein the free magnetic moment of the first STT stack is parallel with that of the fixed magnetic moment of the second STT stack.

9. The non-volatile data retention circuit of claim 7, wherein, in response to the charge current flowing through the giant spin hall metal, the free layer of the first STT stack is configured to exhibit a first free magnetic moment parallel with the fixed magnetic moment of the corresponding fixed layer, and the free layer of the second STT stack is configured to exhibit a second free magnetic moment anti-parallel with the fixed magnetic moment of the corresponding fixed layer.

10. The non-volatile data retention circuit of claim 7, wherein the non-magnetic layer comprises one or more of crystalline MgO and amorphous aluminum oxide, and
wherein each of the free layers of the first and second STT stacks comprise one or more of CoFeB, Fe, and CoFe.

11. The non-volatile data retention circuit of claim 7, wherein each of the fixed layers of the first and second STT stacks comprise a synthetic antiferromagnetic layer.

12. The non-volatile data retention circuit of claim 11, wherein the synthetic antiferromagnetic layer comprises a plurality of magnetic layers antiferromagnetically coupled through and interleaved with thin conductive layers.

13. The non-volatile data retention circuit of claim 1, wherein coupled giant spin hall latch is configured to continue storing the complementary non-volatile spin states even when no power is provided to the non-volatile data retention circuit.

14. A data retention system comprising:
a first volatile data latch configured to store complementary volatile charge states;
a status indicator configured to generate a sleep signal and a wake signal based on a power mode of the data retention system;
a non-volatile data retention circuit comprising:
a coupled giant spin hall latch configured to generate and store complementary non-volatile spin states corresponding to the complementary volatile charge states of the first volatile data latch in response to receiving a charge current from the first volatile data latch, and to generate a differential charge current signal corresponding to the complementary non-volatile spin states in response to application of a read voltage;
a write switch configured to selectively enable flow of the charge current from the first volatile data latch to the coupled giant spin hall latch in response to the sleep signal; and
a read switch configured to selectively enable the application of the read voltage to the coupled giant spin hall latch in response to the wake signal; and
a second volatile data latch configured to read the complementary non-volatile spin states from the non-volatile data retention circuit at power on.

15. The data retention system of claim 14, wherein the first volatile data latch is configured to store volatile complementary states only when powered on, and wherein the first and second volatile data latches are the same.

16. A method of retaining complementary volatile charge states of a volatile data latch when powered down, the method comprising:
receiving a sleep signal indicative of initiation of power down mode from a status indicator; and
in response to receiving the sleep signal:
coupling, via a write switch, output nodes of the volatile data latch to opposite ends of a giant spin hall metal of a coupled giant spin hall latch to receive a charge current from the volatile data latch through the giant spin hall metal;
applying a voltage to first and second spin transfer torque (STT) stacks of the coupled giant spin hall latch, the first and second STT stacks being at opposite sides of the giant spin hall metal; and
generating and storing, by the coupled giant spin hall latch, complementary non-volatile spin states corresponding to the complementary volatile charge states of the volatile data latch in response to receiving the charge current from the volatile data latch.

17. The method of claim 16, further comprising decoupling, via a read switch, the giant spin hall metal from a low voltage in response to receiving the sleep signal,
wherein the voltage is a ground voltage.

18. A method of restoring complementary volatile charge states of a volatile data latch when powering up, the method comprising:
receiving a wake signal indicative of initiation of power up mode from a status indicator; and
in response to receiving the wake signal:
coupling, via a read switch, a giant spin hall metal of a coupled giant spin hall latch to a low voltage;
coupling ends of first and second spin transfer torque (STT) stacks of the coupled giant spin hall latch not adjacent to the giant spin hall metal to a read voltage; and
generating a differential charge current signal corresponding to complementary non-volatile spin states stored in the first and second STT stacks, in response to applying the read voltage.

19. The method of claim 18, further comprising decoupling, via first and second write switches, the giant spin hall metal from output nodes of the volatile data latch.

* * * * *